United States Patent
Wurster

(10) Patent No.: US 6,592,382 B2
(45) Date of Patent: Jul. 15, 2003

(54) SIMPLIFIED BOARD CONNECTOR

(76) Inventor: Woody Wurster, 2 Franktown Ct., Washoe Valley, NV (US) 89704

( * ) Notice: Subject to any disclaimer, the term of this patent is extended or adjusted under 35 U.S.C. 154(b) by 0 days.

(21) Appl. No.: 10/023,181

(22) Filed: Dec. 17, 2001

(65) Prior Publication Data

US 2003/0114027 A1 Jun. 19, 2003

(51) Int. Cl.$^7$ .................................................. H01R 9/09
(52) U.S. Cl. ............................................... 439/82; 439/943
(58) Field of Search ....................... 439/82, 943, 751, 439/65, 736, 80, 395, 75, 251

(56) References Cited

U.S. PATENT DOCUMENTS

| | | |
|---|---|---|
| 4,533,203 A | 8/1985 | Feldman et al. |
| 4,550,962 A | 11/1985 | Czeschka |
| 4,842,528 A * | 6/1989 | Frantz .......................... 439/80 |
| D330,540 S | 10/1992 | Tanaka |
| 5,443,401 A | 8/1995 | Champion et al. |
| 5,718,606 A | 2/1998 | Rigby et al. |
| 6,046,912 A | 4/2000 | Leman |
| 6,206,735 B1 * | 3/2001 | Zanolli ....................... 439/736 |
| 6,280,201 B1 | 8/2001 | Morris |

FOREIGN PATENT DOCUMENTS

EP 0938167 A1 8/1999

* cited by examiner

Primary Examiner—Gary Paumen
Assistant Examiner—Phuongchi Nguyen
(74) Attorney, Agent, or Firm—Leon D. Rosen

(57) ABSTRACT

A pair of circuit boards (60, 62) with holes (50, 56), are connected by right angle contacts (10) that are each formed of a single piece of metal with a 90° bend forming first and second elongated contact portions (20, 22) extending along perpendicular axes (24, 26). Each elongated portion has a resiliently compressible pin end (30, 32) for pushing into a circuit board hole, and has a distal end at the bend. A slot (70) at the bend extends into each distal end, with each end of the slot forming a push surface (80, 82) that lies on the corresponding axis. Each pin end of the connector can be installed by a tool projection that enters one end of a slot and pushes the corresponding pin end (20) along its axis. One of the elongated portions (22) can be longer than the other one (20), and an insulative body (64) is attached to the longer elongated portion.

15 Claims, 4 Drawing Sheets

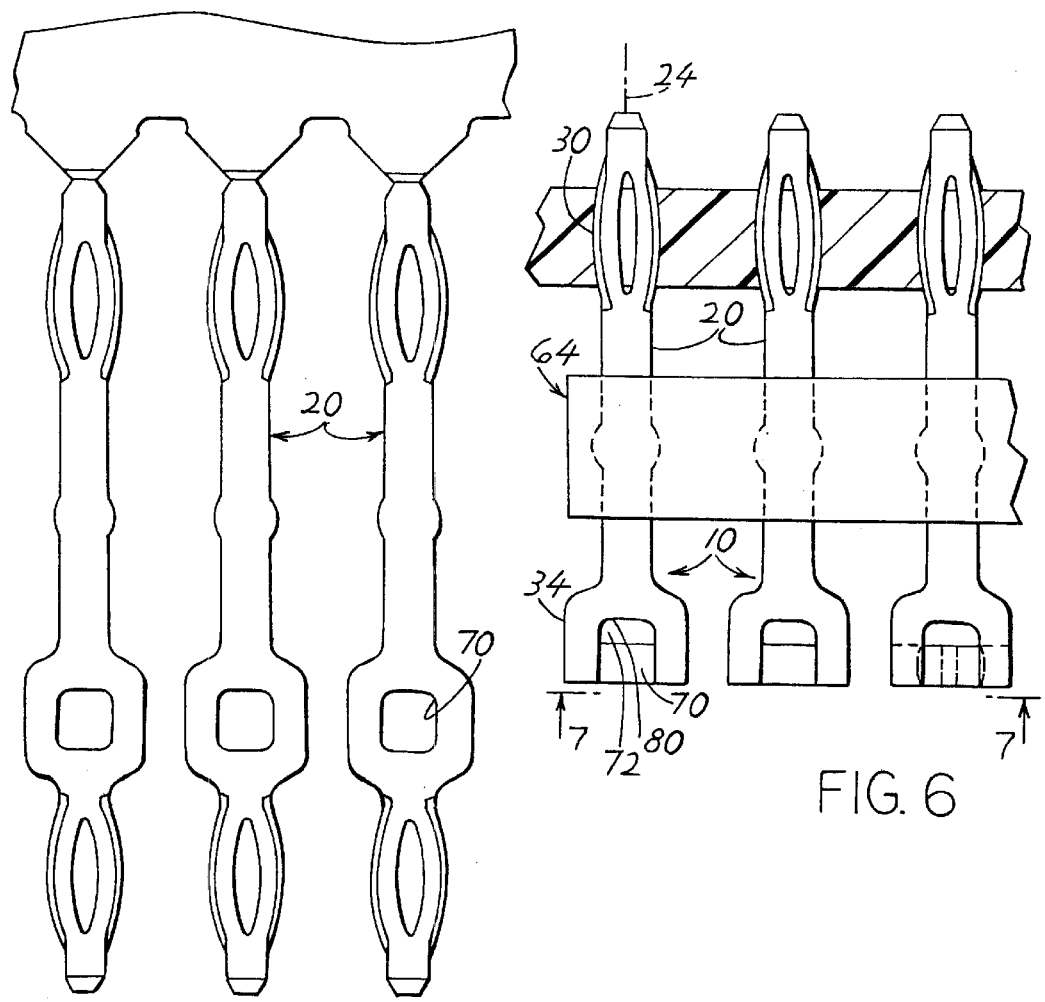
FIG. 5
FIG. 6
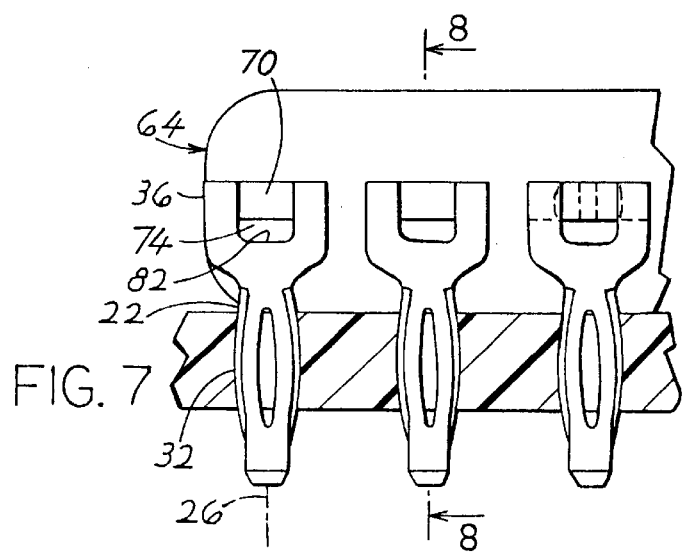
FIG. 7

SIMPLIFIED BOARD CONNECTOR

BACKGROUND OF THE INVENTION

Two circuit boards that extend at right angles to each other, or a circuit board and component thereon, can be connected together by contacts having right angle bends. It is desirable that such right angle contacts be of simple design for lost cost manufacture and be easily connectable at each of its opposite ends, especially to avoid the need for solder connections. In many situations, one or more rows of such contacts are required, and a contact device with such multiple contacts which was of low cost would be of value.

SUMMARY OF THE INVENTION

In accordance with one embodiment of the present invention, a connector device is provided which includes a contact formed of a single piece of metal that is bent at a right angle to form elongated contact portions that extend along perpendicular axes. Each elongated contact portion forms a resiliently-compressible pin end that can be forced into a hole of a circuit board or electronic device, to remain therein by reason of the force fit. The contact has a slot at the right angle bend, with opposite ends of the slot forming push surfaces that can be pushed to install each pin end at a time into a hole.

A plurality of contacts extending along a row are fixed together by an insulator. In one connector device, one of the elongated contact portions has an encapsulated portion spaced from the slot and to which the insulator is molded. This leaves the slot open so a separate tool can be used to push against the push surfaces to install the pin ends. In another connector device, an insulator of high strength polymer is molded around the slot to directly push against the push surfaces at the ends of the slots when forces are applied to the insulator.

The novel features of the invention are set forth with particularity in the appended claims. The invention will be best understood from the following description when read in conjunction with the accompanying drawings.

BRIEF DESCRIPTION OF THE DRAWINGS

FIG. 5 is front elevation view of a group of contacts shown in the course of manufacture, of the type shown in FIG. 1, shown prior to bending.

FIG. 6 is a view taken on line 6—6 of FIG. 2, but shown upside down from the view of FIG. 2.

FIG. 7 is a view taken on line 7—7 of FIG. 2 and on line 7—7 of FIG. 6.

DESCRIPTION OF THE PREFERRED EMBODIMENTS

Figure 1:
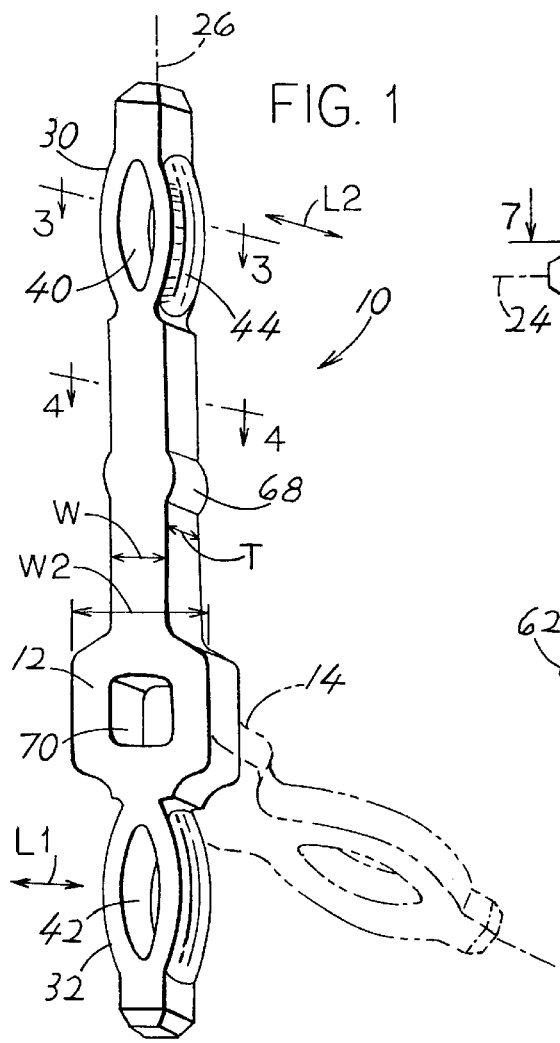
FIG. 1 is an isometric view of a contact of the present invention, showing in phantom lines, a contact end portion that has been bent 90°.
Figure 2:
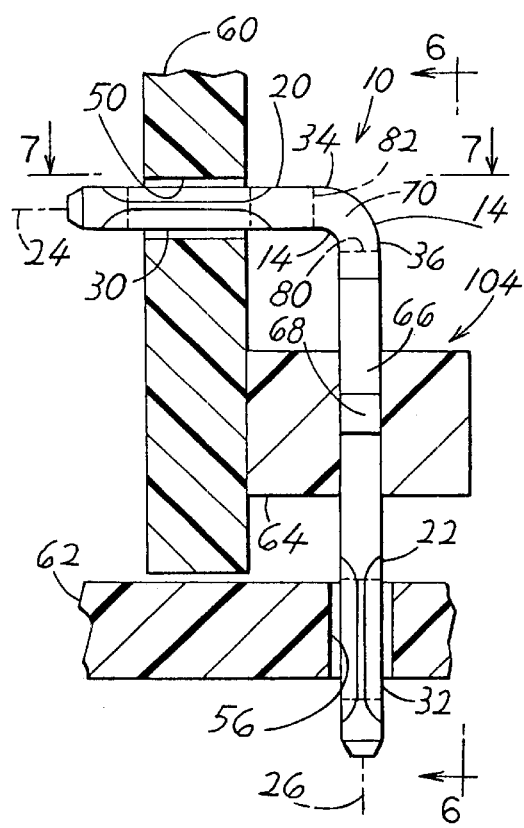
FIG. 2 is a sectional side view of the bent contact of FIG. 1, shown with an overmolded insulator and shown with its pin ends installed in holes of two perpendicular circuit boards.

FIG. 1 illustrates a connector device comprising a contact member 10, prior to being bent 90° at a location 12, and showing, in phantom lines, the bend at 14. FIG. 2 shows that the contact member 10 has first and second elongated portions 20, 22 extending along perpendicular axes 24, 26. Each elongated portion has a free pin end 30, 32 and has an opposite distal end 34, 36. The distal portions form the 90° bend.

Figure 3:
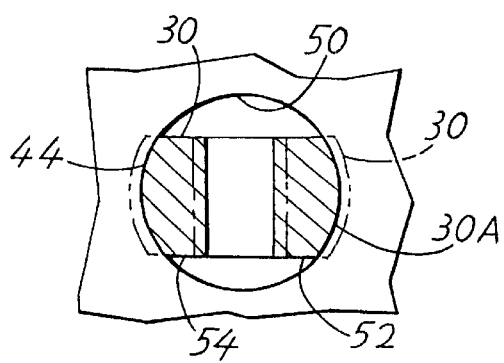
FIG. 3 is a sectional view taken on line 3—3 of FIG. 1, and showing the pin end portion installed in a circuit board hole, with the pin end shown in phantom line prior to installation in the board hole.

Each of the pin ends 30, 32 is resiliently compressible in a direction perpendicular to the corresponding axis. FIG. 1 shows that each pin end 30, 32 is constructed to be resiliently compressible in a direction L1 and L2 that is perpendicular to the corresponding axis. The particular resilient pin ends 30, 32 of FIG. 1 are formed by slots 40, 42 that result in a pair of beams that can be deflected together. It is noted that each beam has a rounded outer portion 44, shown in FIG. 3, to provide large area engagement with the walls of a circuit board hole 50. When a pin end 30 is pushed with high force into a circuit board hole, the beams 52, 54 are resiliently deflected together, so that the pin end acquires the configuration shown at 30A. Applicant uses the term resilient compression to denote a pin end that can be resiliently compressed by at least two percent of its initial width and preferably at least 5% of its initial width and will rebound by at least one half of the compression distance when the compression force is removed. The particular contact shown in FIGS. 1–3 that applicant has designed, are compressed by about 15% of their original width when they are pushed into a circuit board hole.

Figure 4:
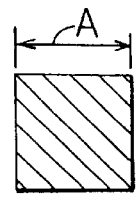
FIG. 4 is a sectional view taken on line 44 of FIG. 1.

The contact member of FIG. 2 has both of its pin ends pushed into a plated hole 50, 56 of a corresponding circuit board 60, 62. The circuit boards extend perpendicular to each other, in that the faces of the two circuit boards extend perpendicular to one another. The contact member 10 and other substantially identical contact members are held together by an insulative body 64 to form a contact device in the form of a connector assembly 104. The insulative body is preferably overmolded around an encapsulated portion 66 of one of the elongated portions 22 of the contact that also forms a pin end 32. It is noted that the elongated portion has a pair of bumps 68 that help trap the contact in the body. Except at the bumps, the encapsulated portion 66 has a square cross section of width A as shown in FIG. 4.

FIGS. 6 and 7 are front elevation views showing three contacts mounted in the insulative body 64. It can be seen that each contact has a slot 70 with first and second opposite slot ends 72, 74 extending into the distal ends 34, 36 of the elongated contact portions 20, 22. Each slot portion forms a push surface 80, 82 where force can be applied to push a corresponding pin end 30, 32 with considerable force into a corresponding circuit board hole.

Each push surface 80, 82 lies on a corresponding axis 24, 26 that extends along the corresponding pin end 30, 32.

Also, each push surface extends normal to the corresponding axis 24, 26. As a result, forces applied along a push surface 80, 82 along a corresponding axis 24, 26 will push the corresponding pin end into the circuit board hole with minimal tendency to cause bending of the corresponding elongated portion 20, 22 of the contact member.

If an installation force is applied to a push surface such as 80, at a considerable angle, such as 10°, to the corresponding axis 24, or if a force is applied at a considerable distance from the axis 24 such as more than 5% of the length of the elongated contact portion, then it is possible for the elongated portion 20 to undergo column-like collapse. That is, if a long thin column is compressed between its ends, the column will collapse by bending. It is noted that where an insulative body 64 of only low to moderate strength is used, only to position the contacts, the body is of little help in preventing such column collapse. By providing a slot portion 72, 74, applicant assures that an installation tool that will press against a corresponding push surface 80, 82 and will apply force in a direction and at a location that are close to a corresponding axis.

Figure 8:
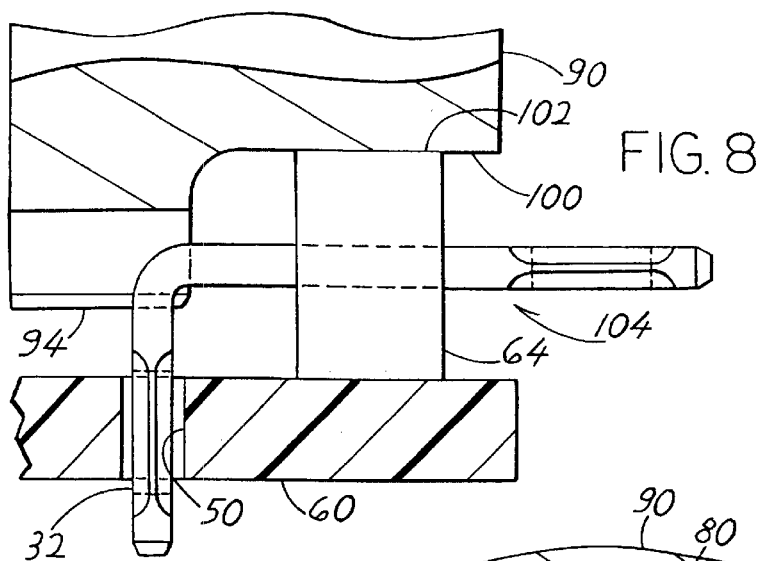
FIG. 8 is a sectional view taken on line 8—8 of FIG. 7, and showing a tool as it inserts a pin end into one circuit board hole.
Figure 10:
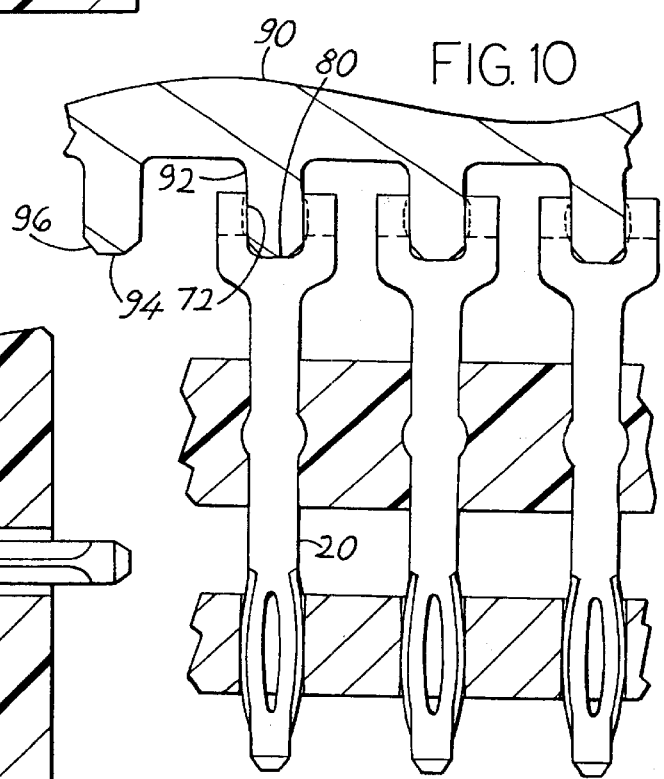
FIG. 10 is a view, taken on line 10—10 of FIG. 9.

FIG. 10 shows an installation tool 90 of a rigid material such as steel, with projections 92 that fit closely in the corresponding slot portion 72 of a contact member elongated portion 20. Each projection 92 has a flat bottom surface 94 which applies a high force to the corresponding push surface 80. Opposite sides 96 of the projection end are beveled to avoid directly engaging the push surface. FIG. 8 shows that the installation tool 90 has a surface 100 that also engages a top surface 102 of the insulative body to press down the body as the contact pin end such as 32 is being inserted into a circuit board hole, to control the orientation of the connector assembly formed by the contacts and insulator, and to control the depth of insertion of the pin end 32 into the circuit board hole 50.

Figure 9:
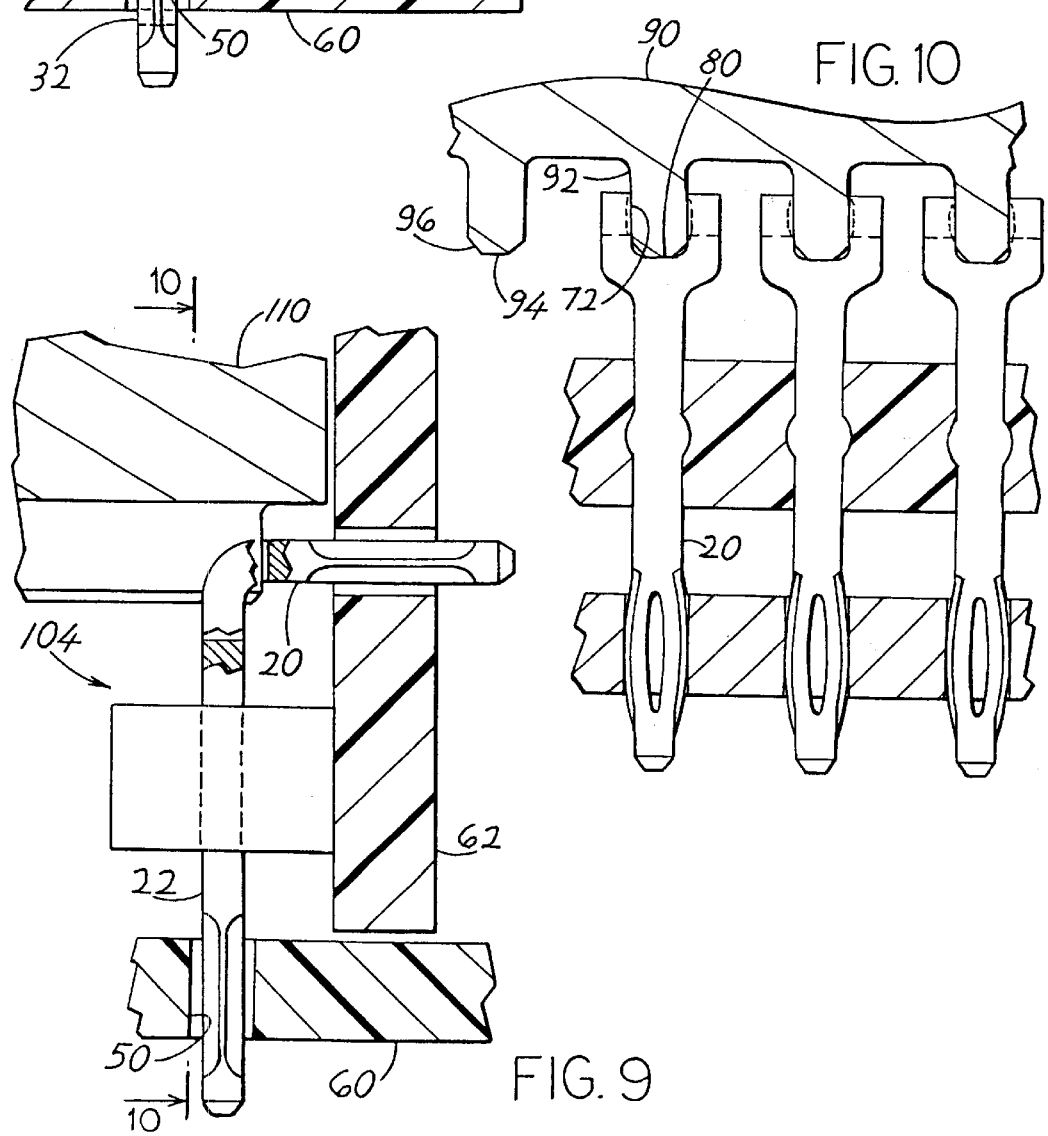
FIG. 9 is a sectional view showing how a contact with a first pin end already inserted into a circuit board, is inserted by a tool into a second circuit board.

FIG. 9 shows a pair of perpendicular circuit boards 60, 62 and the connector assembly 104, wherein one elongated contact portions 22 of each of a plurality of contacts have been inserted into circuit board holes 50, and the other contact portions 20 must be inserted. A tool 110 is used to insert the first contact portion 20 while a backup (not shown) backs up and possibly advances a side of the circuit board 62 opposite the tool 110.

Figure 11:
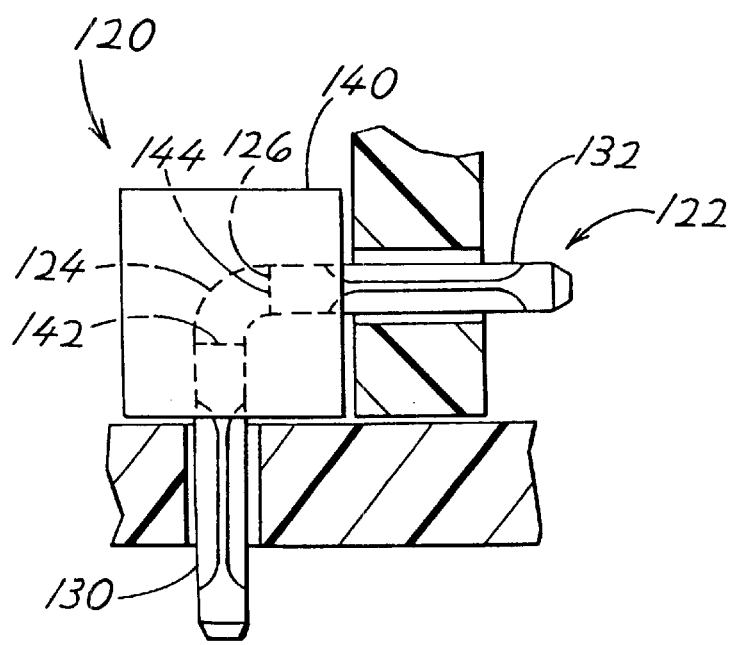
FIG. 11 is a sectional view of a connector constructed in accordance with another embodiment of the invention, which is similar to the connectors of FIGS. 1–10, but with proximal ends of the elongated contact portions overmolded by an insulator.

FIG. 11 shows a connector assembly 120 which includes a contact member 122 with a right angle bend 124, and with a slot 126 in the right angle bend. The contact is of the same construction as shown in FIG. 1, except that both elongated contact portions 130, 132 are of short length. This is made possible because an insulative body 140 which connects the contact member 122 to other contact members, is molded around the bend 124 and into the slot 126 and against push surfaces 142, 144 formed at the ends of the slots. The insulative body 140 is formed of a high strength polymer, so when force is applied directly to a surface of the body 140, the body applied a corresponding force to a corresponding push surface 142, 144 without crumbling or other damage to the material of the insulative body.

A body such as shown at 64 in FIG. 6, is useful to hold a plurality of contact members 10 together to facilitate mounting the members in a circuit board. However, it is possible to instead supply a large number of the contact members so they are loose and are installed by a manufacturer of a device that has a pair of circuit board, in holes in the circuit boards. This can be accomplished, for example, by holding each of multiple contact members 10 in a fixture that holds them aligned with a row of circuit board holes, or by simply inserting one end of each contact member in a circuit board. Once one pin end of each contact member is installed in a circuit board, the orientations of the contact members are fixed and it is easier to simultaneously insert the other pin ends into holes of another circuit board.

Figure 12:
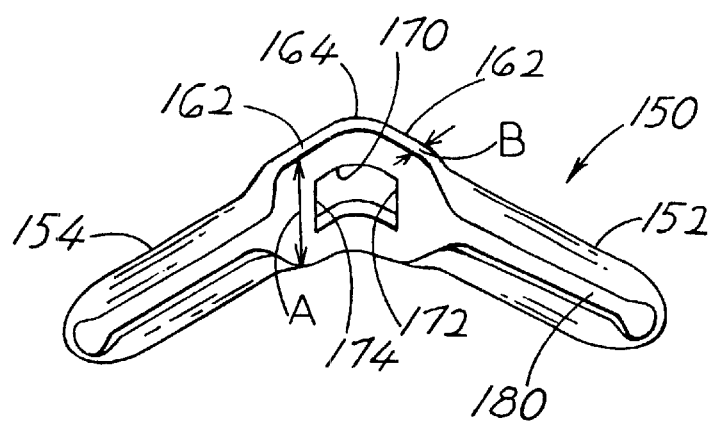
FIG. 12 is an isometric view of a contact constructed in accordance with another embodiment of the invention.

FIG. 12 illustrates another contact member 150 with resilient pin ends 152, 154. Distal ends 160, 162 are connected at a right angle bend 164. A slot 170 extends into each distal end, and forms a push surface 172, 174 at each end of the slot. The particular contact member 150 is formed of a strip of metal having an initial average width A that is a plurality of times greater than its initial thickness B. Each pin end 152, 154 is formed by bending a portion of the sheet metal into a cylinder with a gap 180 that can be partially enclosed as the pin end is compressed during insertion into a circuit board hole.

Although resiliently compressible pin ends are often desirable, it is also possible to press fit a narrow non-resiliently compressible pin end into a long narrow hole and have the pin end remain in place.

Thus, the invention provides a connector device which includes a contact member formed of a single piece of metal and having at least one and preferably two perpendicular elongated contact portions each extending along a separate axis. Each elongated contact portion forms a pin end that is resiliently compressible in a direction perpendicular to its axis. A slot extends into a distal end of each elongated contact portion, and forms a push surface with at least a portion of the push surface lying on the axis and preferably extending normal (perpendicular) to the axis. A plurality of contact members with right angle bends, with a slot extending into each bend to form a push surface, may be connected together by an insulative body. In one embodiment, the body is spaced from the slot to allow a separate high strength installing tool to push along the push surfaces. In another embodiment, the insulative body is formed of high strength polymer material, is molded around the slot to directly engage the push surfaces, and can withstand forces applied to the insulative member to install each pin end of the contact member in a hole of a circuit board or other electrical component.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A connector device for insertion into a circuit board hole comprising:

a contact member that has a first elongated portion that is elongated along a first axis, said first elongated portion having a first pin end for insertion along said first axis into said circuit board hole, and said first elongated portion having a first distal portion spaced along said first axis from said first pin end;

said first pin end being resiliently compressible in a direction perpendicular to said axis to enable it to be forced into the circuit board hole;

said first distal portion has a slot lying on said first axis, said slot having an open outer slot end that is open in a direction away from said first pin end, and said slot has a slot inner end forming a push surface that is substantially normal to said first axis so a force applied along said first axis to said push surface will push the first pin end into a circuit board hole while minimizing the risk of column-type collapse of the first elongated portion;

said push surface is exposed, so a tool can be inserted into the slot to push directly against the push surface, and the tool then can be removed along the axis.

2. A connector device comprising:

a contact member formed of a single piece of metal and having first and second elongated portions extending along first and second perpendicular axes, said elongated portions each having a free pin end and an opposite distal end, said distal ends joined at a 90° bend;

said contact member having a continuous slot that extends into each of said distal ends and that forms a slot portion in each distal end, each slot portion forming a push surface with at least a push surface portion that is normal to the corresponding axis, so each push surface portion can be pushed to insert the corresponding pin end into a hole of a circuit board.

3. The connector device described in claim 2 wherein:

said contact has a constant thickness and has an increased width along said slot and a smaller width beyond said slot.

4. The connector device described in claim 2 wherein:

said piece of metal that forms said contact has a substantially constant thickness except for rounding of opposite edges at said pin ends.

5. The connector device described in claim 2 including:

a pair of circuit boards that lie in perpendicular planes and that each have plated holes;

said pin ends each lies in a hole of a different one of said circuit boards, and said insulative body lies against one of said circuit boards.

6. The connector device described in claim 2 wherein:

each of said pin ends is resiliently compressible in a direction perpendicular to the corresponding axis.

7. The connector device described in claim 2 including:

a plurality of substantially identical contacts lying in a row, said contact member being one of said contacts;

an insulative body that joins to said row of contacts to fix the relative positions of said contacts.

8. The connector device described in claim 7 wherein:

said insulative body surrounds a region of the first elongated portion of each of said contacts, but not the slots of said contacts, to allow a separate installing tool to enter said slots to push the pin ends of said contacts into holes.

9. The connector device described in claim 7 wherein:

said insulative body is formed of a high strength rigid polymer and surrounds said slots, so the pin ends can be pushed into holes by pressing directly against said insulative body.

10. A connector device and a pair of circuit boards that have plated holes, wherein:

said connector device includes a row of contacts and an insulative body that is molded around and that joins said contacts together;

each of said contacts is formed of a single piece of metal that has a right angle bend and first and second contact end portions extending along perpendicular axes that merge at said right angle bend;

said first and second contact end portions each having a pin end that is resiliently compressible in a direction perpendicular to the corresponding axis and that must be compressed to fit into said plated holes;

each of said contacts has a pair of push surfaces lying adjacent to said bend, each push surface extending normal to the corresponding axis and lying substantially on the corresponding axis so the contact end portions do not buckle when the push surfaces are pushed to push said end portions into said plated holes.

11. The connector device described in claim 10 wherein:

said second contact end portions are longer than said first contact end portions and each second contact end portion has an elongated body-mount region that is surrounded by said body, with said push surfaces of each contact being exposed to enable an insertion tool to directly engage each push surface.

12. The connector device described in the claim 10 wherein:

each said second contact end portions has a body-mount region of largely rectangular cross-section along most of its.

13. A connector device for insertion into first and second circuit board holes comprising:

a contact member that has first and second elongated portions that are elongated respectively along first and second perpendicular axes, said first elongated portion having a first pin end for insertion along said first axis into said first circuit board hole and said second elongated portion having a second pin end for insertion along said second axis into said second circuit board hole;

said first and second pin ends are each resiliently compressible in a direction perpendicular to said first and second axes, respectively, to enable the pin end to be forced into a corresponding one of said circuit board holes;

said first and second elongated portions have distal end portions opposite said pin ends, said distal ends merging at an intersection, said intersection forming a 90 degree bend;

said contact member has a slot that extends into said 90° bend along both of said distal end portions, said slot forming a first push surface that is substantially normal to said first axis and said slot forming a second push surface that is substantially normal to said second axis, so a force applied along said first or second axis to said first or second push surface will push the first or second pin end into a circuit board hole while minimizing the risk of column-type collapse of the corresponding elongated portion.

14. A connector device and a pair of circuit boards that have plated holes, wherein:

said connector device includes a row of contacts and an insulative body that joins said contacts together and holds them in a row;

each of said contacts is formed of a single piece of metal that has a right angle bend and first and second contact end portions extending along perpendicular axes that merge at said right angle bend;

said first and second contact end portions each having a pin end that is resiliently compressible in a direction perpendicular to the corresponding axis;

said contacts each has a slot at its bend, said slot extending into each of said contact end portions and each slot having a slot end lying in each of said contact end portions with each slot end forming a push surface extending normal to the corresponding axis and lying substantially on the axis.

15. A connector device for insertion into circuit board holes comprising:

a plurality of contact members that each has an elongated portion that is elongated along an axis, said elongated portions each having a resiliently compressible pin end for insertion along its axis into a circuit board hole, and said elongated portions each having a distal portion spaced along said axis from said pin end;

said pin ends each being resiliently compressible in a direction perpendicular to said axis to enable it to be forced into a circuit board hole;

said distal portions each has a slot lying on the corresponding axis, said slot having a slot end forming a push surface that is substantially normal to said axis so a force applied along said axis to said push surface will push the pin end into a circuit board hole while minimizing the risk of column-type collapse of the elongated portion;

an insulative body that joins said contact members together so they extend in a row, said contact members each having an intermediate part extending between the push surface and the resiliently compressible pin end, and said body is fixed to the intermediate part but not to the distal portion or the resiliently compressible pin end of each contact member;

the push surface of each contact member being exposed so a tool can be inserted into said slots to push the push surfaces to insert the resiliently compressible first pin ends into the circuit board holes, and the tool then can be removed along the axis of the contact elongated portion.

* * * * *